United States Patent [19]

Mattfeld et al.

[11] Patent Number: 4,799,027
[45] Date of Patent: Jan. 17, 1989

[54] LOW-FREQUENCY AMPLIFIER

[75] Inventors: Johann Mattfeld, Obersulm; Joachim Sinderhauf, Kochersteinsfeld, both of Fed. Rep. of Germany

[73] Assignee: Telefunken electronic GmbH, Heilbronn, Fed. Rep. of Germany

[21] Appl. No.: 103,405

[22] Filed: Oct. 1, 1987

[30] Foreign Application Priority Data

Oct. 1, 1986 [DE] Fed. Rep. of Germany ....... 3633415

[51] Int. Cl.$^4$ .............................................. H03F 3/30
[52] U.S. Cl. .................................... 330/267; 330/273
[58] Field of Search ................. 330/267, 268, 273, 274

[56] References Cited

U.S. PATENT DOCUMENTS 4,077,013 2/1978 Morez et al. ...................... 330/267

FOREIGN PATENT DOCUMENTS 2822037 4/1979 Fed. Rep. of Germany .
3409417 4/1986 Fed. Rep. of Germany .

OTHER PUBLICATIONS

Karl-Ernst Reinarz, NF-Leistungsverstaerker, Radio Mentor Elektronic, pp. 114–118, 1972.

Primary Examiner—James B. Mullins
Attorney, Agent, or Firm—Spencer & Frank

[57] ABSTRACT

The invention relates to a low-frequency amplifier with an integrated push-pull B final stage and a circuit for adjusting the quiescent current. The invention resides in the amplifier comprising two circuits for adjusting the quiescent current which are provided for different voltage ranges of the supply voltage. An electronic switchover device ensures automatic activation of that circuit for quiescent current adjustment which is suited for the respective voltage range.

11 Claims, 2 Drawing Sheets

LOW-FREQUENCY AMPLIFIER

BACKGROUND OF THE INVENTION

The invention relates to a low-frequency amplifier with an integrated push-pull class B final stage and a circuit for adjusting the quiescent current.

The permissible operating voltage range required for integrated low-frequency push-pull class B amplifiers is becoming progressively larger. The reason for this is that these low-frequency amplifiers are to be used for all kinds of equipment, for example, for portable sets with headphones as well as for medium-sized and larger equipment, with power supply overvoltages being taken into consideration, requires operating voltages of up to 16 V.

A further requirement exists with respect to adjustment of the quiescent current. As small a quiescent current as possible is desired in order to keep the load on batteries low. Crossover distortions can, however, occur with quiescent currents which are too low and, therefore, a compromise must also be sought with respect to adjustment of the quiescent current. The output dc voltage of the low frequency push-pull class B amplifier should have the optimum value required for maximum low-frequency output power. The output dc voltage should, therefore, correspond approximately to half of the operating voltage.

Two suitable low-frequency amplifier circuits which meet some of the above-mentioned requirements are known from German Patent No. 3,409,417. These known circuits are shown in FIGS. 1 and 2 and, for better understanding, are explained in detail hereinbelow.

The final stage shown in FIG. 1 comprises transistors T12 and T13 of the same conduction type. The lower final stage branch with transistor T13 is driven via a complementary transistor T11 which simultaneously effects the phase reversal. The base of this complementary transistor T11 is connected to the collector of driver transistor T1. The collector of the driver transistor T1 is connected via diode D2 and current source Q3 to supply voltage $U_s$. The voltage at point M constituting the output of the final stage is adjusted to half of the battery voltage by a control circuit which is not illustrated. This point M is connected to the junction between the final stage transistors T12 and T13 and constitutes the output of the amplifier circuit with the load $R_L$.

In the circuit shown in FIG. 1, the adjusting circuit for the quiescent current comprises diode D2, across which a voltage drop U2 is generated, and diodes D7 and D8 across which corresponding voltage drops U7 and U8 are generated. The anode connection of the diode series circuit comprising diodes D7 and D8 is at the base electrode of transistor T10, complementary with transistor T11, and is further connected via a current source Q9 to the positive pole of supply voltage source $U_s$. The cathode of diode D8 is at point M and hence at the output of the final stage amplifier. The emitter electrodes of transistors T10 and T11 are interconnected. The collector of transistor T10 is connected to the positive pole of the supply voltage source. The junction point between source Q3 and diode D2 is connected to the base electrode of a transistor T4 whose emitter is at M and whose collector branch contains diode D5, across which the base-emitter voltage for transistor T6 drops. The collector of transistor T6 is connected to the control or base electrode of the final stage transistor T12 and can be connected to M via a resistor R23. Diodes D2, D7 and D8 together with the base emitter paths of transistors T4, T10 and T11, form a voltage loop. The sum of the voltages at the base-emitter paths of these transistors consequently coincides with the sum of the voltages at diodes D2, D7 and D8. The voltage drop across diodes D2, D7 and D8 can be adjusted by corresponding selection of the currents of current sources Q3 and Q9 such that the desired current flows in transistor T4 and in transistor T11, respectively, which then predetermines the quiescent current of final stage transistors T12 and T13. On account of the necessary voltage drop across diodes D7 and D8, the supply voltage in the circuit of FIG. 1 must not drop below 3 V as the voltage drop required for operating current source Q9 would otherwise not be large enough. On the other hand, this disadvantage is contrasted with the advantage that the current flowing through diodes D7 and D8 is very small since the base current of transistor T10 is smaller by this current gain factor than the current flowing through collector T11.

In the circuit shown in FIG. 2, the supply voltage can be further reduced. In this circuit, transistor T10 is eliminated and the diode chain consisting of diodes D7 and D8 is replaced by a single diode D14. The anode of this diode D14 is directly connected to the emitter of the complementary transistor T11, whose collector drives the base electrode of final stage transistor T13. The voltage at point M is, therefore, only raised by a diode forward voltage U14. Thus the potential at the anode of diode D14 is approximately 0.7 V lower than the comparable potential at the base electrode of transistor T10 in FIG. 1. The voltage loop is formed by diodes D2 and D14 and by the base-emitter paths of transistors T4 and T11. Therefore, the voltage $U_s$ can drop to values of up to 1.8 V as a voltage of approximately 1.6 V is then present at the emitter of transistor T11 and the residual voltage of 0.2 V is just adequate to operate the current source Q15. When the circuit is driven by a signal, a current which increases as the signal increases flows through final stage transistors T12 and T13. Hence the base current of transistor T13 also rises and, consequently, the emitter current of transistor T11. To enable transistor T11 to prepare for this change in the emitter current, the current flowing through current source Q15 and hence also through diode D14 must be chosen relatively large in comparison to the emitter current of transistor T11. Therefore, in the circuit of FIG. 2 the advantage of a reducible supply voltage is contrasted with the disadvantage of the higher current consumption.

SUMMARY OF THE INVENTION

The object underlying the invention is to provide a new circuit for a low-frequency amplifier which combines the advantages of both known circuits in a suitable way. To achieve this object, in a circuit of the kind described at the outset, it is suggested, in accordance with the invention, that two different adjusting circuits be provided for the quiescent current, with the first quiescent current circuit (FIG. 2) being optimized with respect to the voltage drop and the second quiescent current circuit (FIG. 1) being optimized with respect to the current consumption, and that an electronic switch-over device be provided to activate at low supply voltage the first quiescent current circuit, with the latter being switched off when a certain value of the supply voltage is reached and adjustment of the quiescent current then being effected solely via the second quiescent current circuit.

A differential amplifier is preferably provided as switchover device, with a stabilized dc voltage at one input electrode and the other input connected to the tap of a voltage divider connected to the supply voltage. The voltage divider is so dimensioned and the stabilized dc voltage so selected that at low supply voltage the first quiescent current (FIG. 2) circuit is activated via a current mirror circuit.

DESCRIPTION OF THE PREFERRED EMBODIMENT

Figures 1, 2:
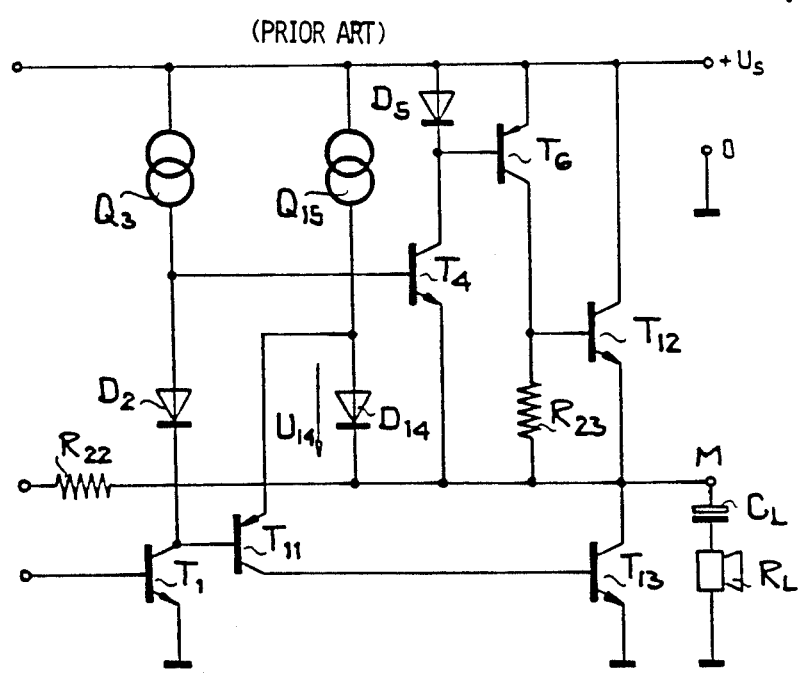
FIG. 1 is a schematic diagram illustrating a conventional low-frequency amplifier having a relatively low quiescent current.
FIG. 2 is a schematic diagram illustrating a conventional low-frequency amplifier which will operate at a lower supply voltage than the amplifier of FIG. 1 but which has a higher current consumption.
Figure 3:
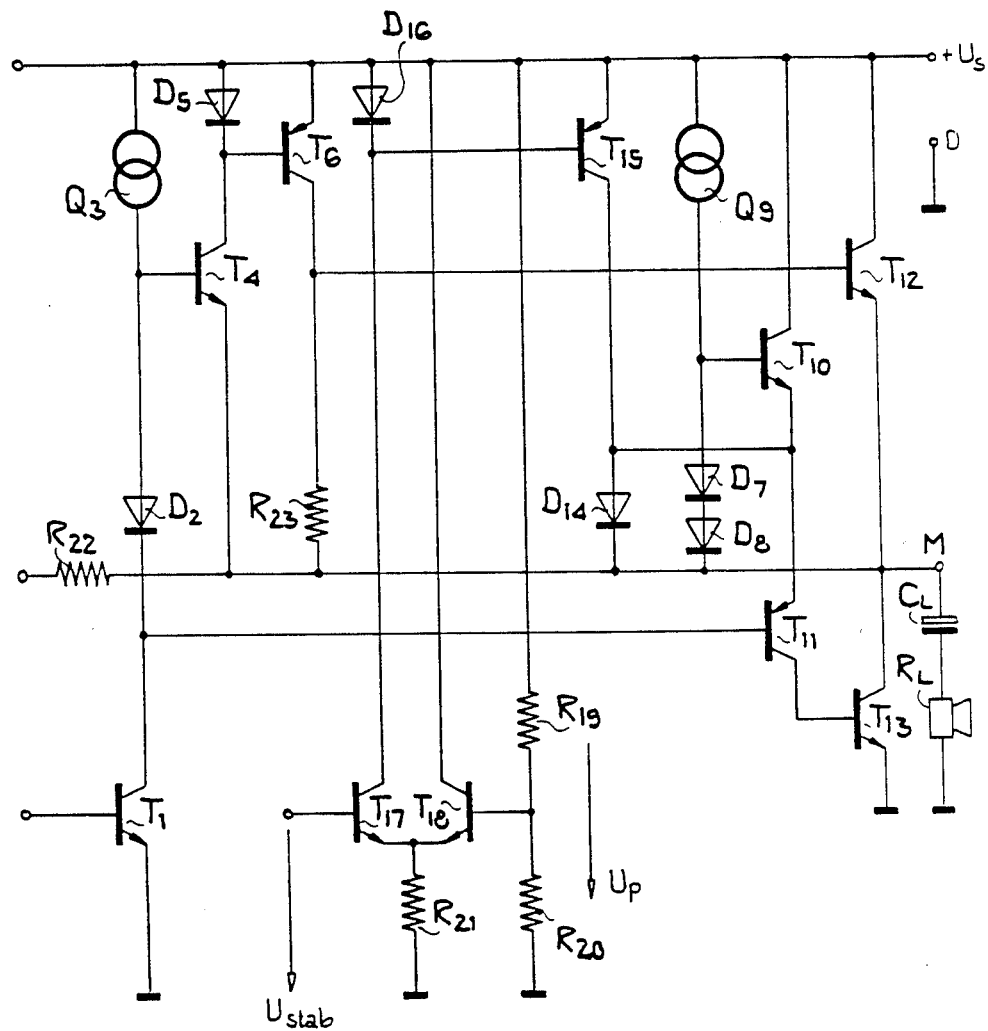
FIG. 3 is a schematic diagram illustrating a low-frequency amplifier according to the invention.

FIG. 3 shows a circuit of the inventive low-frequency amplifier in which the circuit elements have been designated in the same way as the corresponding circuit elements in FIGS. 1 and 2. The circuit of FIG. 3 contains two quiescent current circuits, with the first quiescent current circuit corresponding to the circuit described in connection with FIG. 2. The second quiescent current circuit (FIG. 1), which is optimized with respect to the current consumption, corresponds to the circuit described in conjunction with FIG. 1. However, the circuit of FIG. 3 contains, in addition, a differential amplifier comprising the two transistors T17 and T18 connected at the emitter electrodes, with these emitters being connected to reference potential via resistor R21. Located in the collector branch of transistor T17 is a diode D16, conductive in the flow direction, which is arranged parallel to the base-emitter path of transistor T15 and forms with it current source Q15 (FIG. 2). Transistor T15 supplies the current for diode D14, which serves in the above-described manner to adjust the quiescent current. A stabilized dc voltage of, for example, 1.2 V is present at the base electrode of transistor T17. The base voltage of transistor T18 is taken from a voltage divider comprising resistors R19 and R20 at its tap. The above-mentioned voltage divider is connected to supply voltage $U_s$ and the base potential of transistor T18 is, therefore, directly dependent on the supply voltage. The collector of transistor T18 is connected to the positive pole of the supply voltage source.

The switchover device is so dimensioned that at low voltage values of the dc supply voltage $U_s$, the base potential of transistor T18 is not adequate to drive it as the stabilized dc voltage $U_{stab}$ at the base electrode of transistor T17 is larger. Consequently, transistor T17 is conductive and hence the current mirror comprising diode D16 and transistor T15 is also activated. Since the anode of diode D14 is connected to the emitter of the complementary transistor T11, the adjustment of the quiescent current is carried out in the manner described in conjunction with FIG. 2.

At larger values of the supply voltage $U_s$, the voltage at the base electrode of transistor T18 exceeds the stabilized dc voltage at the base electrode of transistor T17 and, therefore, this transistor T17 is blocked. Hence diode D14 becomes currentless. Quiescent current adjustment is now controlled in accordance with the arrangement of FIG. 1 by diodes D2, D7, and D8 and transistors T4, T10 and T11. Diodes D7 and D8 are driven via current source Q9, with a relatively low current being adequate since current amplification occurs in transistor T10. In a suitable embodiment of the circuit, the dimensioning is such that the current source comprising diode D14 is switched off at a supply voltage of from 2.5 V to 3 V. At smaller voltage values, the current source Q9 remains inactive since the supply voltage is inadequate to supply the necessary voltage drops across diodes D7 and D8.

The inventive circuit offers the great advantage that with an embodiment of a low-frequency amplifier supply voltages can be tolerated in a very large range of, for example, between 1.6 V and 16 V. In the circuit of FIG. 3, transistors T17 and T18 of the switchover device are preferably npn transistors. T15, T11 and T6 are pnp transistors.

What is claimed is:

1. A low-frequency amplifier for use with a power source which provides a supply voltage, comprising:
   means for receiving a signal to be amplified;
   a quasi-complimentary final stage which receives power from the power source;
   a complimentary transistor, connected between the final stage and the means for receiving a signal to be amplified, to effect phase reversal; and
   means for setting a quiescent current through the final stage, the means for setting including
   a first quiescent current circuit which is optimized for low-voltage use, the first quiescent current circuit being selectively actuatable,
   means for actuating the first quiescent current circuit when the supply voltage is below a predetermined valve, and
   a second quiescent current circuit which is optimized for low current consumption, the second quiescent current circuit setting the quiescent current at least when the first quiescent current circuit is not actuated.

2. The low-frequency amplifier of claim 1, wherein the means for actuating the first quiescent current circuit comprises: a voltage divider connected to the power source, the voltage divider having a tap; a differential amplifier having an input port which is connected to the tap of the voltage divider and having another input port which receives a stabilized dc voltage, the differential amplifier additionally having an output port; and a current mirror circuit connected to the output port of the differential amplifier, wherein the voltage divider and the stabilized dc voltage are selected so that the first quiescent current circuit is actuated via the current mirror circuit when the supply voltage is below the predetermined valve.

3. The low-frequency amplifier of claim 2, wherein the current mirror comprises a current-source transistor, and wherein the first quiescent current circuit comprises a voltage-generating diode which is connected to the current-source transistor and to the complimentary transistor, the value of the current flowing through the voltage-generating diode being selected so that, when the final stage is driven at full power, the diode current is adequate to maintain the forward voltage of the diode.

4. The low-frequency amplifier of claim 3, wherein the final stage has an output port, wherein the cathode of the diode is connected to the output port, and wherein the anode of the diode is connected to the emitter of the complimentary transistor.

5. The low-frequency amplifier of claim 1, wherein the amplifier comprises a further transistor, the emitters of the further transistor and the complimentary transistor being connected, and wherein the second quiescent current circuit comprises two series-connected diodes, the base of the further transistor being driven by a dc voltage drop at the pair of diodes.

6. A low-frequency amplifier for use with a power source which provides a supply voltage, comprising:
   a transistorized push-pull class B final stage which receives power from the power source;
   means for setting the quiescent current through the final stage at a predetermined small value of the means employing circuitry which requires a supply voltage of more than a predetermined voltage value for operation;
   further means for setting the quiescent current through the final stage at another value which is larger than the predetermined small value, the further means being selectively actuatable and employing circuitry which does not require a supply voltage of more than the predetermined voltage value for operation; and
   switchover means, responsive to the supply voltage, for actuating the further means when the supply voltage is too low for operation of the means.

7. The low-frequency amplifier of claim 6, wherein the means for setting the quiescent current through the final stage at a predetermined small value comprises first and second diodes connected in series, one of the first and second diodes being connected to the final stage, and wherein the further means comprises a further diode which is connected to the final stage and to one of the first and second diodes.

8. The low-frequency amplifier of claim 7, wherein the further means further comprises a further transistor which is connected between the power source and the further diode, and wherein the switchover means comprises means connected to the base of the further transistor for comparing the supply voltage with a reference voltage.

9. The low-frequency amplifier of claim 6, wherein the power source has first and second supply terminals, wherein the final stage comprises first and second transistors, the collector of the first transistor being connected to the first supply terminal, the emitter of the second transistor being connected to the second supply terminal, and the emitter of the first transistor being connected to the collector of the second transistor, wherein the means for setting the quiescent current through the final stage at a predetermined small value comprises first and second diodes, the cathode of the first diode being connected to the anode of the second diode and the cathode of the second diode being connected to the emitter of the first transistor, and wherein the further means comprises a third diode, the cathode of the third diode being connected to the emitter of the first transistor.

10. The low-frequency amplifier of claim 9, wherein the further means further comprises a third transistor, the emitter of the third transistor being connected to the first supply terminal and the collector of the further transistor being connected to the anode of the third diode, and wherein the switchover means comprises a voltage divider connected to the first supply terminal, a differential amplifier having an input port which is connected to the voltage divider and having another input port which receives a reference voltage, the differential amplifier additionally having an output port which is connected to the base of the third transistor.

11. The low-frequency amplifier of claim 6, wherein the predetermined voltage value is about three volts.

* * * * *